(12) United States Patent
Zhong (10) Patent No.: US 11,602,075 B2
(45) Date of Patent: Mar. 7, 2023

(54) COOLING APPARATUS PROVIDING IMMERSION COOLING

(71) Applicant: Alibaba Group Holding Limited, Grand Cayman (KY)

(72) Inventor: Yangfan Zhong, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 90 days.

(21) Appl. No.: 16/760,334

(22) PCT Filed: Oct. 24, 2018

(86) PCT No.: PCT/CN2018/111625
§ 371 (c)(1),
(2) Date: Apr. 29, 2020

(87) PCT Pub. No.: WO2019/085801
PCT Pub. Date: May 9, 2019

(65) Prior Publication Data
US 2021/0185857 A1  Jun. 17, 2021

(30) Foreign Application Priority Data
Nov. 3, 2017  (CN) .................. 201711071271.6

(51) Int. Cl.
*H05K 7/20*  (2006.01)
(52) U.S. Cl.
CPC ..... *H05K 7/20236* (2013.01); *H05K 7/20272* (2013.01); *H05K 7/20281* (2013.01); *H05K 7/20781* (2013.01)

(58) Field of Classification Search
CPC ...... H05K 7/20; H05K 7/20236; H05K 7/203; H05K 7/20445; H05K 7/20272;
(Continued)

(56) References Cited

U.S. PATENT DOCUMENTS 3,996,136 A * 12/1976 Jakubek ............. B01D 17/0202
  210/86
4,879,027 A * 11/1989 Sanders .................... C02F 1/76
  210/123
(Continued)

FOREIGN PATENT DOCUMENTS

| CN | 104609608 A | * | 5/2015 |
| CN | 204925964 |  | 12/2015 |

(Continued)

OTHER PUBLICATIONS

English Translation of CN 104609608 (Year: 2015).*

*Primary Examiner* — Zachary Pape
*Assistant Examiner* — Amir A Jalali (57) ABSTRACT

A cooling apparatus for cooling a to-be-cooled device is described. The cooling apparatus includes a cabinet body configured to contain a cooling medium for at least partially immersing the to-be-cooled device, a volumeter for detecting a volume of the cooling medium in the cabinet body, and a storage tank storing the cooling medium. The storage tank and the cabinet body are communicatively connected to each other. Further, when the volumeter detects that the volume of the cooling medium in the cabinet body is lower than a preset volume, the storage tank and the cabinet body come into mutual communication so that the cooling medium in the storage tank is transferred into the cabinet body.

27 Claims, 3 Drawing Sheets (58) Field of Classification Search
CPC ........... H05K 7/20772; H05K 7/20836; H05K 7/20872–20881; H05K 7/20927–20936; H01L 23/34; H01L 23/44; H01L 23/427; H01L 23/46; H01L 23/473

See application file for complete search history.

(56) References Cited

U.S. PATENT DOCUMENTS

| | | | |
|---|---|---|---|
| 5,293,754 A * | 3/1994 | Mizuno | H01L 23/473 165/286 |
| 5,367,723 A * | 11/1994 | Pleva | E04H 4/12 137/428 |
| 5,435,379 A * | 7/1995 | Moslehi | F04B 23/028 165/80.4 |
| 5,614,979 A * | 3/1997 | Itoh | G03D 3/065 396/578 |
| 5,928,503 A * | 7/1999 | Shang-Chun | B01D 61/12 210/86 |
| 6,360,559 B1 * | 3/2002 | Midorikawa | H05K 7/20272 361/689 |
| 8,035,972 B2 | 10/2011 | Ostwald et al. | |
| 8,780,552 B2 | 7/2014 | El-Essawy et al. | |
| 8,830,672 B2 | 9/2014 | Alshinnawi et al. | |
| 9,258,926 B2 | 2/2016 | Smith | |
| 9,326,430 B2 | 4/2016 | Neumann et al. | |
| 9,351,429 B2 | 5/2016 | Shelnutt et al. | |
| 9,408,332 B2 | 8/2016 | Smith | |
| 9,491,892 B1 | 11/2016 | Carlson et al. | |
| 9,596,787 B1 | 3/2017 | Iyengar et al. | |
| 9,606,588 B2 | 3/2017 | Dean et al. | |
| 9,622,379 B1 * | 4/2017 | Campbell | H05K 7/20318 |
| 9,699,939 B2 | 7/2017 | Smith | |
| 9,839,162 B2 | 12/2017 | Crawford | |
| 9,907,206 B2 | 2/2018 | Branton | |
| 10,015,912 B2 | 7/2018 | Inano et al. | |
| 10,130,013 B1 | 11/2018 | Iyengar et al. | |
| 10,136,551 B2 | 11/2018 | Branton | |
| 10,212,849 B2 | 2/2019 | Matsumoto et al. | |
| 10,410,955 B2 | 9/2019 | Tsai et al. | |
| 10,613,601 B2 | 4/2020 | Eriksen | |
| 10,806,056 B2 | 10/2020 | Cuda et al. | |
| 10,881,031 B2 | 12/2020 | Luo et al. | |
| 10,888,029 B2 | 1/2021 | Jochim et al. | |
| 10,917,998 B2 | 2/2021 | Shelnutt et al. | |
| 10,939,590 B2 | 3/2021 | Bonnin et al. | |
| 2008/0113454 A1 * | 5/2008 | Doni | H01L 21/31111 438/5 |
| 2009/0126910 A1 * | 5/2009 | Campbell | F28D 15/00 165/104.33 |
| 2011/0175737 A1 * | 7/2011 | Pforte | G05D 23/1931 340/584 |
| 2012/0180979 A1 * | 7/2012 | Harrington | H05K 7/20281 165/11.1 |
| 2014/0102672 A1 * | 4/2014 | Campbell | F28D 1/02 165/105 |
| 2014/0218861 A1 * | 8/2014 | Shelnutt | H05K 7/20809 361/679.53 |
| 2015/0245539 A1 * | 8/2015 | Pelletier | |
| 2016/0113150 A1 | 4/2016 | Krug, Jr. et al. | |
| 2016/0234970 A1 | 8/2016 | Shelnutt et al. | |
| 2016/0379852 A1 * | 12/2016 | Tustaniwskyj | H01L 21/67109 165/296 |
| 2017/0280587 A1 * | 9/2017 | Watanabe | H05K 7/20272 |

FOREIGN PATENT DOCUMENTS

| | | |
|---|---|---|
| CN | 205566950 | 9/2016 |
| CN | 206344498 | 7/2017 |
| CN | 107045382 | 8/2017 |
| CN | 206413342 | 8/2017 |
| CN | 206676102 U * | 11/2017 |
| CN | 207519036 | 6/2018 |
| JP | 5853072 | 2/2016 |

* cited by examiner

COOLING APPARATUS PROVIDING IMMERSION COOLING

REFERENCE TO RELATED APPLICATIONS

The present application claims priority to Chinese Patent Application No. 201711071271.6 entitled "Cooling Apparatus" and filed on Nov. 3, 2017, and to PCT application PCT/CN2018/111625, entitled "Cooling Apparatus" and filed on Oct. 24, 2018, the contents of which are incorporated herein by reference in their entirety.

BACKGROUND

With the rapid development of cloud computing technology (e.g., large-scale distributed system technology), the requirements for the computing performance of servers are increasing. With improving server performance, power consumption is also increasing rapidly, at an exponential rate. Data shows that the power consumption of data center servers has increased by nearly a factor of 15 per unit in the past decade. In the past, the power consumption of a server was generally 1.5 kW-2 kW. However, the power consumption of some contemporary servers has reached as high as 20 kW-30 kW.

Servers in data centers are usually cooled by way of air-conditioning and air-cooling. However, with the steady increase in power consumption per unit, the cooling capacity provided by many data centers is approaching their limit. Therefore, the conventional way of air-conditioning and air-cooling has been unable to meet the increasing cooling demand of servers in data centers. In addition, air-conditioning and air-cooling consume a large and increasing amount of energy, space and cost.

SUMMARY

The present disclosure provides a cooling apparatus to improve the cooling efficiency for servers in data centers.

According to a first aspect of the embodiments of the present disclosure, a cooling apparatus for cooling a to-be-cooled device includes: a cabinet body configured to contain a cooling medium for at least partially immersing the to-be-cooled device; a first volumeter for detecting the volume of the cooling medium in the cabinet body; and a replenishing device including a storage tank storing a cooling medium, where the storage tank and the cabinet body are communicatively connected to each other; and when the first volumeter detects that the volume of the cooling medium in the cabinet body is lower than a first preset volume, the storage tank and the cabinet body come into mutual communication so that the cooling medium in the storage tank is transferred into the cabinet body.

Further, according to the first aspect, the cooling apparatus includes a second volumeter and an alarm device which are in communication connection, where the second volumeter is configured to detect the volume of the cooling medium in the storage tank; and when the second volumeter detects that the volume of the cooling medium in the storage tank is lower than a second preset volume, the alarm device issues an alarm.

Further, according to the first aspect, the cooling apparatus includes a driving device for driving the cooling medium between the storage tank and the cabinet body.

Further, according to the first aspect, when the first volumeter detects that the volume of the cooling medium in the cabinet body is lower than the first preset volume, the storage tank and the cabinet body come into mutual communication (a connection between the storage tank and the cabinet body is opened), and the driving device drives the cooling medium in the storage tank into the cabinet body; and when the first volumeter detects that the volume of the cooling medium in the cabinet body reaches a second preset volume, the connection between the storage tank and the cabinet body is closed, and the driving device stops, where the second preset volume is higher than the first preset volume.

Further, according to the first aspect, when the first volumeter detects that the volume of the cooling medium in the cabinet body exceeds the second preset volume, the storage tank and the cabinet body come into mutual communication (the connection between the storage tank and the cabinet body is opened), and the driving device drives the cooling medium in the cabinet body into the storage tank; and when the first volumeter detects that the volume of the cooling medium in the cabinet body is restored to the second preset volume, the connection between the storage tank and the cabinet body is closed, and the driving device stops, where the second preset volume is higher than the first preset volume.

Further, according to the first aspect, the cooling apparatus includes a valve and a control system, where the valve is configured for switching between mutual communication and mutual closure of (opening and closing the connection between) the storage tank and the cabinet body, and the control system is in communication with both the first volumeter and the valve; and when the first volumeter detects that the volume of the cooling medium in the cabinet body is lower than the first preset volume, the control system controls the valve to open so that the storage tank and the cabinet body come into mutual communication (are connected); when the first volumeter detects that the volume of the cooling medium in the cabinet body reaches the first preset volume, the control system controls the valve to close so that the storage tank and the cabinet body are closed with respect to each other (not connected).

Further, according to the first aspect, the cabinet body has a first diversion opening for guiding the cooling medium, the storage tank has a second diversion opening in communication with the first diversion opening, and the valve is disposed between the first diversion opening and the second diversion opening or disposed inside the storage tank at a position corresponding to the second diversion opening.

Further, according to the first aspect, the storage tank is disposed above the cabinet body, and the second diversion opening is located above the first diversion opening.

Further, according to the first aspect, the cooling apparatus includes a heat exchanging device, where one end of the heat exchanging device is in communication with (coupled to) the cabinet body, and the other end of the heat exchanging device is in communication with (coupled to) an external liquid supply apparatus; and the heat exchanging device is configured to drive the cooling medium to circulate in the cabinet body and to exchange heat with the cooling medium.

According to a second aspect of the embodiments of the present disclosure, a cooling apparatus for cooling a to-be-cooled device includes: a cabinet body configured to contain a cooling medium for at least partially immersing the to-be-cooled device, where the cabinet body is provided with a first diversion opening for introducing the cooling medium and a second diversion opening for discharging the cooling medium; and a filtering device, where the filtering device is provided with a third diversion opening in communication with the first diversion opening and a fourth diversion opening in communication with the second diversion opening, and where the filtering device is configured to drive the cooling medium in the cabinet body through the filtering device for filtering the cooling medium.

Further, according to the second aspect, the filtering device includes a filter and a driving pump provided in communication with (coupled to) the filter, the driving pump is configured to drive the cooling medium in the cabinet body through the filter for filtering; one of the filter and the driving pump has the third diversion opening, and the other of the filter and the driving pump has the fourth diversion opening.

Further, according to the second aspect, the cooling apparatus includes a first detection system and a valve, where the first detection system is configured to detect the purity of the cooling medium in the cabinet body, and the valve is disposed between the first diversion opening and the third diversion opening or between the second diversion opening and the fourth diversion opening; and when the first detection system detects that the purity of the cooling medium in the cabinet body is lower than a set value, the valve is opened, and the driving pump drives the cooling medium in the cabinet body through the filter for filtering.

Further, according to the second aspect, the cooling apparatus includes a storage device in communication with (coupled to) the driving pump, and the driving pump is configured to drive the cooling medium in the cabinet body into the storage device.

Further, according to the second aspect, the cooling apparatus includes a valve between the storage device and the driving pump; when that valve is opened, the driving pump drives the cooling medium in the cabinet body into the storage device.

Further, according to the second aspect, the cooling apparatus includes a cover disposed at the top of the cabinet body, a control system in communication connection with the filtering device, and a second detection system in communication connection with the control system; the second detection system is configured to detect whether the cover is open or closed; in response to detecting that the cover is in a closed state, the second detection system sends a first detection signal to the control system, and the control system controls the filtering device to stop; in response to detecting that the cover is in an open state, the second detection system sends a second detection signal to the control system, and the control system controls the filtering device to operate (start).

Further, according to the second aspect, the cooling apparatus includes a heat exchanging device, where one end of the heat exchanging device is provided in communication with the cabinet body, and the other end of the heat exchanging device is in communication with (coupled to) an external liquid supply apparatus; the heat exchanging device is configured to drive the cooling medium to circulate in the cabinet body and to exchange heat with the cooling medium.

According to a third aspect of the embodiments of the present disclosure, a cooling apparatus for cooling a to-be-cooled device includes: a cabinet body configured to contain a cooling medium for at least partially immersing the to-be-cooled device, where the cabinet body is provided with a first diversion opening for introducing (receiving) the cooling medium and a second diversion opening for discharging the cooling medium; a first volumeter for detecting the volume of the cooling medium in the cabinet body; a replenishing device including a storage tank storing a cooling medium, where the storage tank and the cabinet body are communicatively connected (coupled) to each other; and a filtering device, where the filtering device is provided with a third diversion opening in communication with (coupled to) the first diversion opening and a fourth diversion opening in communication with (coupled to) the second diversion opening, and the filtering device is configured to drive the cooling medium in the cabinet body to flow through the filtering device for filtering; when the first volumeter detects that the volume of the cooling medium in the cabinet body exceeds a first preset volume, the storage tank and the cabinet body come into mutual communication (are connected), and the filtering device drives the cooling medium in the cabinet body into the storage tank.

Further, according to the third aspect, the cooling apparatus includes a second volumeter and an alarm device that are in communication, where the second volumeter is disposed in the storage tank and configured to detect the volume of the cooling medium in the storage tank; and when the second volumeter detects that the volume of the cooling medium in the storage tank is lower than a second preset volume, the alarm device issues an alarm.

Further, according to the third aspect, the filtering device includes a filter and a driving pump provided in communication with (coupled to) the filter, the driving pump is configured to drive the cooling medium in the cabinet body through the filter for filtering; one of the filter and the driving pump has the third diversion opening, and the other of the filter and the driving pump has the fourth diversion opening.

Further, according to the third aspect, the cooling apparatus includes a first detection system and a valve, where the first detection system is configured to detect the purity of the cooling medium in the cabinet body, and the valve is disposed between the first diversion opening and the third diversion opening or between the second diversion opening and the fourth diversion opening; and when the first detection system detects that the purity of the cooling medium in the cabinet body is lower than a set value, the valve is opened, and the driving pump drives the cooling medium in the cabinet body through the filter for filtering.

Further, according to the third aspect, the filtering device includes a driving pump for driving the cooling medium between the storage tank and the cabinet body; when the first volumeter detects that the volume of the cooling medium in the cabinet body exceeds the first preset volume, the storage tank and the cabinet body come into mutual communication (are connected), and the driving pump drives the cooling medium in the cabinet body into the storage tank; and when the first volumeter detects that the volume of the cooling medium in the cabinet body is restored to the first preset volume, the storage tank and the cabinet body are closed with respect to each other (not connected), and the driving pump stops.

Further, according to the third aspect, when the first volumeter detects that the volume of the cooling medium in the cabinet body is lower than a second preset volume, the storage tank and the cabinet body come into mutual communication (are connected), and the filtering device drives the cooling medium in the storage tank into the cabinet body.

Further, according to the third aspect, the filtering device includes a driving pump for driving the cooling medium between the storage tank and the cabinet body; when the first volumeter detects that the volume of the cooling medium in the cabinet body is lower than the second preset volume, the storage tank and the cabinet body come into mutual communication (are connected), and the driving pump drives the cooling medium in the storage tank into the cabinet body; and when the first volumeter detects that the volume of the cooling medium in the cabinet body reaches the first preset volume, the storage tank and the cabinet body are closed with respect to each other (not connected), and the driving pump stops, where the second preset volume is lower than the first preset volume.

Further, according to the third aspect, the cooling apparatus further includes a valve and a control system; the valve is configured for switching between mutual communication and mutual closure of (opening and closing a connection between) the storage tank and the cabinet body, and the control system is in communication with both the first volumeter and the valve; and when the first volumeter detects that the volume of the cooling medium in the cabinet body is lower than the first preset volume, the control system controls the first valve to open so that the storage tank and the cabinet body come into mutual communication (are connected); and when the first volumeter detects that the volume of the cooling medium in the cabinet body reaches the first preset volume, the control system controls the first valve to close so that the storage tank and the cabinet body are closed with respect to each other (not connected).

Further, according to the third aspect, the storage tank has a fifth diversion opening in communication with the first diversion opening, and the valve is disposed between the first diversion opening and the fifth diversion opening or disposed inside the storage tank at a position corresponding to the fifth diversion opening.

Further, according to the third aspect, the storage tank is disposed above the cabinet body, and the fifth diversion opening is located above the first diversion opening.

Further, according to the third aspect, the cooling apparatus includes a heat exchanging device, where one end of the heat exchanging device is in communication with (coupled to) the cabinet body, and the other end of the heat exchanging device is in communication with (coupled to) an external liquid supply apparatus; and the heat exchanging device is configured to drive the cooling medium to circulate in the cabinet body and to exchange heat with the cooling medium.

As can be seen from the above technical solutions, with the cooling apparatus of the present disclosure, on one hand, as the cooling medium in the cabinet body is gradually consumed during use, when the first volumeter detects that the volume of the cooling medium in the cabinet body is lower than the first preset volume (e.g., when the volume of the cooling medium reaches the minimum requirement), the storage tank and the cabinet body come into mutual communication (are connected) so that the cooling medium in the storage tank of the replenishing device is transferred into the cabinet body, thereby realizing the function of automatically replenishing the cooling medium to the cabinet body without manual intervention, which improves the maintenance efficiency of the cooling apparatus and further improves the cooling efficiency of the cooling apparatus for servers in data centers. On the other hand, as the cooling medium in the cabinet body is polluted during use, the cooling medium can be filtered by the filtering device to filter out impurities in the cooling medium to ensure normal operation of the cooling apparatus with no need of manual replacement of the cooling medium on a regular basis, which improves the maintenance efficiency of the cooling apparatus and further improves the cooling efficiency of the cooling apparatus for the servers in data centers.

DETAILED DESCRIPTION

Embodiments will be described in detail herein, examples of which are illustrated in the drawings. When the following description refers to the drawings, the same numerals in different drawings refer to the same or similar elements, unless otherwise indicated. The implementations described in the following embodiments do not represent all implementations consistent with the present disclosure. Instead, they are merely examples of devices and methods consistent with some aspects, as detailed in the appended claims, of the present disclosure.

The terminology used in the present specification is merely for the purpose of describing specific embodiments, but not intended to limit the present disclosure. The singular forms "a," "said," and "the" as used in the present specification and the appended claims are also intended to include plural forms unless otherwise other meanings are explicitly indicated. The term "and/or" as used herein refers to and encompasses any or all possible combinations of one or more associated listed items.

Although the terms "first," "second," "third," etc., may be used in the present specification to describe various types of information, such information should not be limited to these terms. These terms are only used to distinguish the same type of information from each other, depending on the context. For example, depending on the context, the term "second preset volume" is used simply as a way to distinguish one preset volume from another preset volume (e.g. a "first preset volume"), and vice versa. That same "second preset volume" may be elsewhere referred to as a "third preset volume" if necessary, to distinguish it from two other preset volumes. Also, for example, the word "if" as used herein may be interpreted as "at the time of" or "when" or "in response to a determination."

The present disclosure provides a cooling apparatus to improve the cooling efficiency for servers in data centers. The cooling apparatus of the present disclosure will be described in detail below with reference to the drawings. The features in the following embodiments and implementations may be combined with each other.

Embodiment 1

Figure 1:
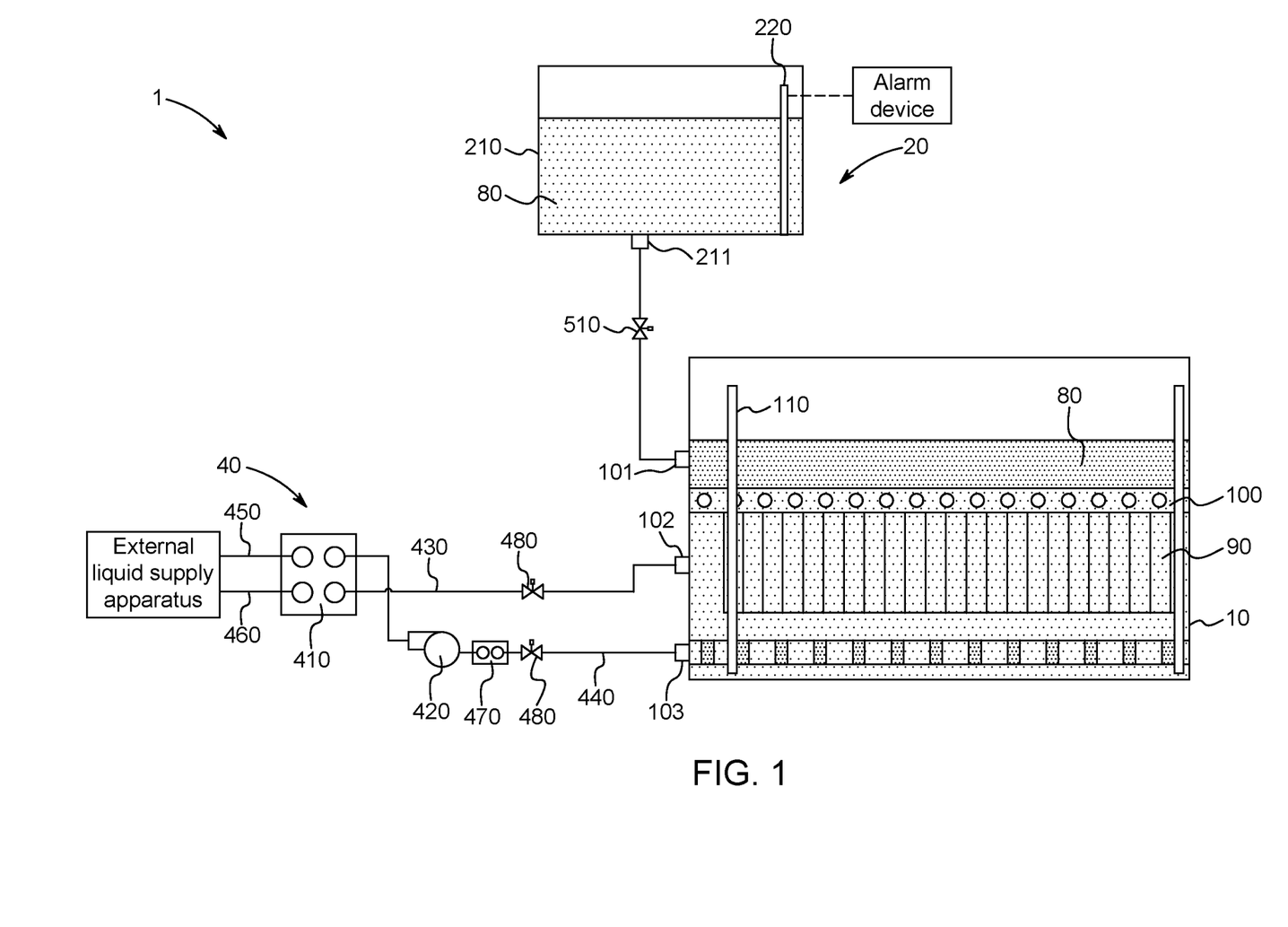
FIG. 1 is a schematic structural diagram of a cooling apparatus according to an example embodiment of the present disclosure.

Referring to FIG. 1, an embodiment of the present disclosure provides a cooling apparatus 1 that uses a single-phase immersion liquid cooling technology for cooling a to-be-cooled device 90. The to-be-cooled device 90 may be a server in a data center, or it may be another heat-producing apparatus that needs to be cooled. The cooling apparatus 1 includes a cabinet body 10, a first volumeter 110, and a replenishing device 20. The cabinet body 10 may be provided with plug-in components 100, and the to-be-cooled device 90, which may be a sheet-type structure, is sequentially plugged into the plug-in components 100. The cabinet body 10 may contain a non-conductive cooling medium 80 that at least partially immerses the to-be-cooled device 90, and the first volumeter 110 is configured to detect the volume or level of the cooling medium 80 in the cabinet body 10. The replenishing device 20 includes a storage tank 210 for storing the cooling medium 80. The storage tank 210 and the cabinet body 10 are communicatively connected (coupled) to each other. When the first volumeter 110 detects that the volume of the cooling medium 80 in the cabinet body 10 is lower than a first preset volume, the storage tank 210 and the cabinet body 10 come into mutual communication so that the cooling medium 80 in the storage tank 210 is transferred into the cabinet body 10. The cooling medium 80 may completely immerse the to-be-cooled device 90 or it may partially immerse the to-be-cooled device 90; the level of immersion may be set according to actual needs. The cooling medium 80 may be a gaseous medium, a liquid medium, or a solid-liquid mixed medium, which may also be chosen according to actual needs. The first volumeter 110 may be a contact type or a non-contact type volumeter, depending on actual needs. Corresponding changes may be made according to different cooling media 80. For example, if the cooling medium 80 is a liquid, the first volumeter 110 may be a liquid level gauge. In this embodiment, the cooling medium 80 completely immerses the to-be-cooled device 90, and the cooling medium 80 is a liquid electronic fluorinated liquid. The first volumeter 110 is disposed inside the cabinet body 10.

As can be seen from the above technical solutions, with the cooling apparatus 1 of the present disclosure, as the cooling medium 80 in the cabinet body 10 is gradually consumed during use, when the first volumeter 110 detects that the volume or level of the cooling medium is lower than the first preset volume or level (e.g., when the volume or level of the cooling medium in the cabinet body 10 reaches the minimum requirement), the storage tank 210 and the cabinet body 10 come into mutual communication (e.g., they are connected to each other by opening a valve as described further below) so that the cooling medium 80 in the storage tank 210 of the replenishing device 20 is transferred into the cabinet body 10, thereby automatically replenishing the cooling medium in the cabinet body 10 without manual intervention or involvement, which improves the maintenance efficiency of the cooling apparatus 1 and further improves the cooling efficiency of the cooling apparatus 1 for servers in data centers.

In an optional implementation, the cooling apparatus 1 of the present disclosure further includes a first valve 510 and a control system (not shown). The first valve 510 is configured for switching between mutual communication and mutual closure of the storage tank 210 and the cabinet body 10 (that is, the valve 510 can be opened or closed; the valve 510 is configured for switching between opening a closing a connection between the storage tank and the cabinet body), and the control system is in communication with (coupled to) both the first volumeter 110 and the first valve 510. In response to detecting that the volume of the cooling medium 80 in the cabinet body 10 is lower than the first preset volume or level, the first volumeter 110 sends a detection signal to the control system, and the control system controls the first valve 510 to open so that the storage tank 210 and the cabinet body 10 come into mutual communication (that is, a connection between the storage tank and the cabinet body is opened). In response to detecting that the volume or level of the cooling medium 80 in the cabinet body 10 reaches the first preset volume or level, the first volumeter 110 sends a detection signal to the control system, and the control system controls the first valve 510 to close so that the connection between the storage tank 210 and the cabinet body 10 is closed. The control system controls the first valve 510 to open or close, thereby achieving the purpose of automatically replenishing the cabinet body 10 or stopping the replenishing the cabinet body 10, respectively, with the cooling medium 80 in the storage tank 210. Optionally, the first valve 510 is a solenoid valve.

In an optional implementation, the cooling apparatus 1 of the present disclosure further includes a second volumeter 220 and an alarm device (not shown) that are in communication. The second volumeter 220 is configured to detect the volume or level of the cooling medium 80 in the storage tank 210. When the second volumeter 220 detects that the volume or level of the cooling medium 80 in the storage tank 210 is lower than a second preset volume or level, the alarm device triggers an alarm, further achieving the purpose of notifying an operator to replenish the storage tank 210. Optionally, the control system is in communication with both the second volumeter 220 and the alarm device. In response to detecting that the volume or level of the cooling medium 80 in the storage tank 210 is lower than a second preset volume or level, the second volumeter 220 sends a detection signal to the control system and the control system controls the alarm device to trigger the alarm, thereby achieving the purpose of notifying an operator to replenish the storage tank 210. Optionally, the second volumeter 220 is disposed in the storage tank 210. The second volumeter 220 may be a contact type or a non-contact type of volumeter, also depending on actual needs. Corresponding changes may be made according to different cooling media 80. For example, if the cooling medium 80 is a liquid, the second volumeter 220 may be a liquid level gauge.

In an optional implementation, the cooling apparatus 1 of the present disclosure further includes a driving device (not shown in FIG. 1) for driving a cooling medium 80 between the storage tank 210 and the cabinet body 10; that is, the driving device not only can drive the cooling medium 80 in the storage tank 210 into the cabinet body 10, and but also can drive the cooling medium 80 in the cabinet body 10 into the storage tank 210. Optionally, the driving device may be a pump, and the control system may control the pump to operate or to stop. When the cooling medium 80 in the cabinet body 10 needs to be replenished, the cooling medium 80 in the storage tank 210 can be transferred into the cabinet body 10, driven by the pump. When the cooling medium 80 transferred into the cabinet body 10 exceeds the upper limit or when it is necessary to empty the cooling medium 80 in the cabinet body 10 (such as for the purpose of relocation), the cooling medium 80 in the cabinet body 10 can be transferred into the storage tank 210, driven by the pump. Optionally, the driving device is disposed in the storage tank 210.

In response to detecting that the volume of the cooling medium 80 in the cabinet body 10 is lower than the first preset volume or level, the first volumeter 110 sends a detection signal to the control system, and the control system controls the first valve 510 to open so that the storage tank 210 and the cabinet body 10 come into mutual communication (are connected), and the driving device is activated so that the driving device drives the cooling medium 80 in the storage tank 210 into the cabinet body 10, and thus the cabinet body 10 is automatically replenished. In response to detecting that the volume or level of the cooling medium 80 in the cabinet body 10 has reached a third preset volume or level, the first volumeter 110 sends a detection signal to the control system, and the control system controls the first valve 510 to close so that the storage tank 210 and the cabinet body 10 are no longer connected to each other, and the driving device is stopped so that the driving device stops driving the cooling medium 80 in the storage tank 210 into the cabinet body 10, thus stopping the replenishing of the cabinet body 10. The third preset volume or level here is higher than the first preset volume/level, which means that the first preset volume/level indicates the lower limit of the allowable volume/level range of the cooling medium 80 in the cabinet body 10, and the third preset volume/level indicates the upper limit of the allowable volume/level range of the cooling medium 80 in the cabinet body 10.

In response to detecting that the volume of the cooling medium 80 in the cabinet body 10 is higher than the third preset volume or level, the first volumeter 110 sends a detection signal to the control system, and the control system controls the first valve 510 to open so that the storage tank 210 and the cabinet body 10 come into mutual communication, the driving device is activated so that the driving device drives the cooling medium 80 in the cabinet body 10 into the storage tank 210, and the excess cooling medium 80 in the cabinet body 10 is driven (e.g., pumped) into the storage tank 210 to avoid the risk of overflow of the excess cooling medium 80 in the cabinet body 10. In response to detecting that the volume or level of the cooling medium 80 in the cabinet body 10 is restored to the third preset volume/level, the first volumeter 110 sends a detection signal to the control system, and the control system controls the first valve 510 to close so that the storage tank 210 and the cabinet body 10 are no longer connected to each other, and the driving device is stopped so that the driving device stops driving the cooling medium 80 in the cabinet body 10 into the storage tank 210, thus stopping the pumping of the cooling medium 80 from the cabinet body 10.

To empty the cooling medium 80 in the cabinet body 10, the first valve 510 can be controlled directly by the control system to open so that the storage tank 210 and the cabinet body 10 come into mutual communication, and the driving device is activated so that the driving device drives the cooling medium 80 in the cabinet body 10 into the storage tank 210 until the cooling medium 80 in the cabinet body 10 is completely pumped out. The first valve 510 is then closed by the control system so that the storage tank 210 and the cabinet body 10 are not connected to each other, and the driving device is stopped from pumping the cooling medium 80 out of the cabinet body 10.

In an optional implementation, the cabinet body 10 is provided with a first diversion opening 101 for guiding the cooling medium 80, and the storage tank 210 is provided with a second diversion opening 211 in communication with the first diversion opening 101. The first valve 510 is disposed between the first diversion opening 101 and the second diversion opening 211, or is disposed inside the storage tank 210 at a position corresponding to the second diversion opening 211. The first diversion opening 101 and the second diversion opening 211 may be connected through a pipeline. Further, the storage tank 210 is disposed above the cabinet body 10, and the second diversion opening 211 is located above the first diversion opening 101, so that the liquid level of the cooling medium 80 in the storage tank 210 is higher than the liquid level of the cooling medium 80 in the cabinet body 10. When the cooling medium 80 in the cabinet body 10 needs to be replenished, the first valve 510 is opened so that the cooling medium 80 in the storage tank 210 can directly flow into the cabinet body 10 under the force of gravity.

In an optional implementation manner, the cooling apparatus 1 of the present disclosure further includes a heat exchanging device 40, where one end of the heat exchanging device 40 is in communication with (coupled to) the cabinet body 10. The other end of the heat exchanging device 40 is in communication with (coupled to) an external liquid supply apparatus (not shown). The heat exchanging device 40 is configured to drive the cooling medium 80 to circulate in the cabinet body 10 and is also configured to exchange heat with the cooling medium 80. The heat exchanging device 40 drives the cooling medium 80 to circulate in the cabinet body 10 of the cooling apparatus 1 to remove heat from the to-be-cooled device 90. The heat exchanging device 40 exchanges heat with the external liquid supply apparatus so that the cooling medium 80 reaches a low temperature state again and circulates back into the cabinet body 10 of the cooling apparatus 1 to cool the to-be-cooled device 90, thus achieving the purpose of circularly and continuously removing and discharging heat from the to-be-cooled device 90.

Further, the cabinet body 10 has a diversion inlet 102 for introducing (receiving) the cooling medium 80, and a diversion outlet 103 for discharging the cooling medium 80. The heat exchanging device 40 includes a heat exchanger 410 and a diversion pump 420. The heat exchanger 410 is connected to the cooling body 10 of the cooling apparatus 1 through a first circulation loop, and is connected to the external liquid supply apparatus through a second circulation loop. The first circulation loop includes a first pipeline 430 and a second pipeline 440, and the second circulation loop includes a third pipeline 450 and a fourth pipeline 460. The first pipeline 430 is in communication with the diversion inlet 102 on the cabinet body 10 of the cooling apparatus 1, the second pipeline 440 is in communication with the diversion outlet 103 on the cabinet body 10 of the cooling apparatus 1, and the third pipeline 450 and the fourth pipeline 460 are both in communication with the external liquid supply apparatus. Optionally, the heat exchanging device 40 may further include a flow meter 470, and the flow meter 470 may be disposed between the diversion pump 420 and the cabinet body 10 and used for detecting the flow rate of the cooling medium 80. The pressure of the diversion pump 420 may be adjusted according to the detection result of the flow meter 470, so as to achieve the purpose of adjusting the flow rate of the cooling medium 80. Each of the first pipeline 430 and the second pipeline 440 may be provided with a valve 480 to open or close a pipeline through which the cooling medium 80 circulates in the heat exchanging device 40.

When the cooling apparatus 1 of the present disclosure operates, the pump drives the cooling medium 80 to circulate in the cabinet body 10 of the cooling apparatus 1 through the first circulation loop, and the cooling medium 80 removes heat from the to-be-cooled device 90 through circulation in the cabinet body 10 and enters the heat exchanger 410 of the heat exchanging device 40. The external liquid supply apparatus can circulate cooling water in the second circulation loop, and the cooling medium 80 carrying the heat of the to-be-cooled device 90 may exchange heat in the heat exchanger 410 with the cooling water provided by the external liquid supply apparatus to discharge the heat carried by the cooling medium 80, so that the cooling medium 80 reaches a low temperature state again, which can cool the to-be-cooled device 90 again after circulating back into the cooling apparatus 1, thus achieving the purpose of circularly and continuously discharging the heat of the to-be-cooled device 90.

Embodiment 2

Figure 2:
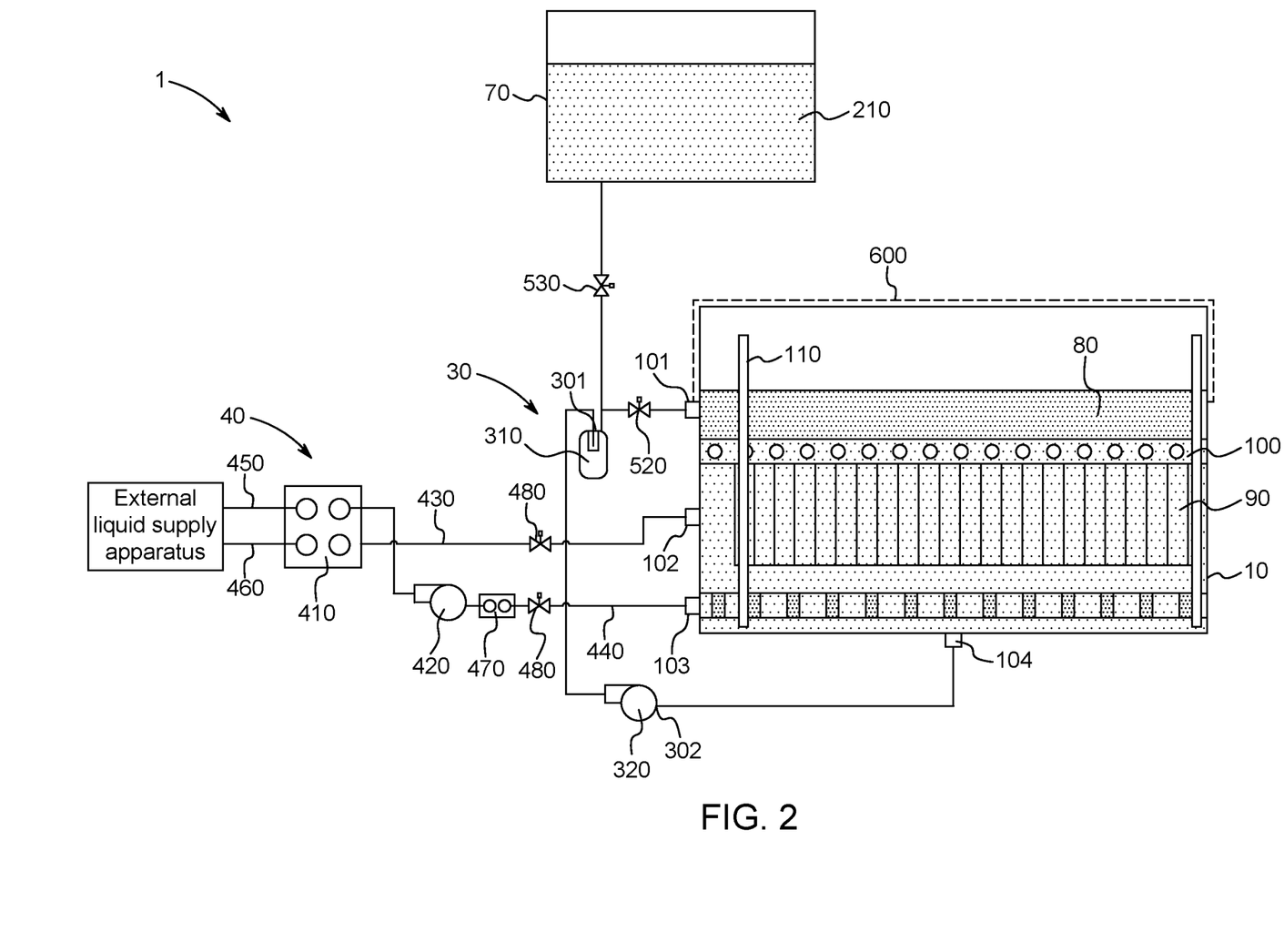
FIG. 2 is a schematic structural diagram of another cooling apparatus according to an example embodiment of the present disclosure.

Referring to FIG. 2, an embodiment of the present disclosure provides a cooling apparatus 1 that uses a single-phase immersion liquid cooling technology for cooling a to-be-cooled device 90. The to-be-cooled device 90 may be a server in a data center or it may be another heat-producing apparatus that needs to be cooled. The cooling apparatus 1 includes a cabinet body 10 and a filtering device 30. The cabinet body 10 may be provided with plug-in components 100, and the to-be-cooled device 90, which may be a sheet-type structure, is sequentially plugged into the plug-in components 100. The cabinet body 10 may contain a cooling medium 80 for at least partially immersing the to-be-cooled device 90, and the cabinet body 10 has a first diversion opening 101 for introducing (receiving) the cooling medium 80, and also has a third diversion opening 104 for discharging the cooling medium 80. The filtering device 30 has a fourth diversion opening 301 in communication with the first diversion opening 101 of the cabinet body 10, and also has a fifth diversion opening 302 in communication with the third diversion opening 104. The filtering device 30 is configured to drive the cooling medium 80 in the cabinet body 10 to flow through the filtering device 30 for filtering. The cooling medium 80 may completely immerse the to-be-cooled device 90, or it may partially immerse the to-be-cooled device 90; the level of immersion may be set according to actual needs. The cooling medium 80 may be a gaseous medium, a liquid medium, or a solid-liquid mixed medium, which may also be chosen according to actual needs. In this embodiment, the cooling medium 80 completely immerses the to-be-cooled device 90, and the cooling medium 80 is a liquid electronic fluorinated liquid. The third diversion opening 104 may be disposed at the bottom of the cabinet body 10, the first diversion opening 101 and the fourth diversion opening 301 may be connected by a pipeline, and the third diversion opening 104 and the fifth diversion opening 302 may be connected by a pipeline.

As can be seen from the above technical solutions, with the cooling apparatus 1 of the present embodiment, if the cooling medium 80 in the cabinet body 10 is polluted during use, the cooling medium 80 can be filtered by the filtering device 30 to filter out impurities in the cooling medium 80 to ensure that the cooling apparatus 1 can operate properly with no need of manual replacement of the cooling medium 80 on a regular basis, which improves the maintenance efficiency of the cooling apparatus 1 and further improves the cooling efficiency of the cooling apparatus 1 for servers in data centers.

In an optional implementation, the filtering device 30 includes a filter 310 and a driving pump 320 in communication with (coupled to) the filter 310. The driving pump 320 is configured to drive the cooling medium 80 in the cabinet body 10 to flow through the filter 310 for filtering. Either the filter 310 or the driving pump 320 includes the fourth diversion opening 301, and the other of the filter 310 and the driving pump 320 includes the fifth diversion opening 302. In the example shown in FIG. 2, the driving pump 320 is located closer to the third diversion opening 104 of the cabinet body 10, and the filter 310 is located closer to the first diversion opening 101 of the cabinet body 10; accordingly, the fourth diversion opening 301 is disposed in the filter 310, and the fifth diversion opening 302 is disposed in the driving pump 320. If the cooling medium 80 in the cabinet body 10 is polluted during use, the cooling medium 80 in the cabinet body 10 can be driven by the driving pump 320 to flow through the filter 310 so that impurities in the cooling medium 80 are filtered out, thus ensuring normal operation of the cooling apparatus 1.

In an optional implementation, the cooling apparatus 1 of the present disclosure further includes a control system (not shown), a first detection system (not shown), and a second valve 520. In an embodiment, the second valve 520 is a solenoid valve, and the control system is in communication with the driving pump 320, the first detection system, and the second valve 520. The first detection system is configured to detect the purity of the cooling medium 80 in the cabinet body 10, and the second valve 520 is disposed between the first diversion opening 101 and the fourth diversion opening 301, or is disposed between the third diversion opening 104 and the fifth diversion opening 302. In the example shown in FIG. 2, the second valve 520 is disposed between the first diversion opening 101 and the fourth diversion opening 301.

When the first detection system detects that the purity of the cooling medium 80 in the cabinet body 10 is lower than a set value, it indicates that the purity of the cooling medium 80 in the cabinet body 10 does not meet requirements, and so the first detection system then sends a detection signal to the control system, and the control system controls the second valve 520 to open and activates the driving pump 320 so that the driving pump 320 drives the cooling medium 80 in the cabinet body 10 through the filter 310 for filtering, and thus the cooling medium 80 in the cabinet body 10 is filtered automatically. When the first detection system detects that the purity of the cooling medium 80 in the cabinet body 10 reaches a set value, it indicates that the purity of the cooling medium 80 in the cabinet body 10 meets requirements, and so the first detection system then sends a detection signal to the control system, and the control system controls the second valve 520 to close and stops the driving pump 320 so that the driving pump 320 stops driving the cooling medium 80 in the cabinet body 10 through the filter 310. The control system may also control the second valve 520 to open and control the driving pump 320 to always be in an operating state so that the driving pump 320 continuously drives the cooling medium 80 in the cabinet body 10 through the filter 310 for filtering, thus ensuring that the cooling medium 80 in the cabinet body 10 is always filtered.

In an optional implementation, the cooling apparatus 1 of the present disclosure further includes a storage device 70 in communication with (coupled to) the driving pump 320, and the driving pump 320 is further configured to drive the cooling medium 80 in the cabinet body 10 into the storage device 70. When it is necessary to empty the cooling medium 80 in the cabinet body 10 (such as for the purpose of relocation), the cooling medium 80 in the cabinet body 10 is transferred into the storage device 70, driven by the driving pump 320.

Further, the cooling apparatus 1 of the present disclosure includes a third valve 530 disposed between the storage device 70 and the driving pump 320. In an embodiment, the third valve 530 is a solenoid valve. When it is necessary to empty the cooling medium 80 in the cabinet body 10, the third valve 530 can be controlled by the control system to open, and the driving pump 320 is activated so that the driving pump 320 drives the cooling medium 80 in the cabinet body 10 into the storage device 70 until the cooling medium 80 in the cabinet body 10 is completely pumped out. The third valve 530 is then closed by the control system, and the driving pump 320 is also stopped.

In an optional implementation, the cooling apparatus 1 of the present disclosure further includes a cover (600) disposed at the top of the cabinet body 10, a control system in communication with the filtering device 30, and a second detection system (not shown) in communication with the control system. The second detection system is configured to detect the state (open/closed) of the cover. When the second detection system detects that the cover is in a closed state, it sends a first detection signal to the control system, and the control system controls the filtering device 30 to stop. When the second detection system detects that the cover is in an open state, it sends a second detection signal to the control system, and the control system controls the filtering device 30 to operate. In other words, the state (open or closed) of the cover of the cabinet body 10 is used as the condition for triggering operation of the filtering device 30. When the cover of the cabinet body 10 is closed for normal cooling and heat dissipation, the filtering device 30 operates. The filtering device 30 starts filtering the cooling medium 80 only when the cover of the cabinet body 10 is open, which can reduce energy consumption.

In an optional implementation, the cooling apparatus 1 of the present disclosure further includes a heat exchanging device 40. One end of the heat exchanging device 40 is in communication with (coupled to) the cabinet body 10, and the other end of the heat exchanging device 40 is in communication with (coupled to) an external liquid supply apparatus (not shown). The heat exchanging device 40 is configured to drive the cooling medium 80 to circulate in the cabinet body 10, and is also configured to exchange heat with the cooling medium 80. The heat exchanging device 40 drives the cooling medium 80 to circulate in the cabinet body 10 of the cooling apparatus 1 to remove heat from the to-be-cooled device 90, and the heat exchanging device 40 exchanges heat with the external liquid supply apparatus so that the cooling medium 80 reaches a low temperature state again and circulates back into the cabinet body 10 of the cooling apparatus 1 to cool the to-be-cooled device 90, thus achieving the purpose of circularly and continuously removing and discharging heat from the to-be-cooled device 90.

Further, the cabinet body 10 also has a diversion inlet 102 for introducing (receiving) the cooling medium 80, and a diversion outlet 103 for discharging the cooling medium 80. The heat exchanging device 40 includes a heat exchanger 410 and a diversion pump 420. The heat exchanger 410 is connected to the cooling body 10 of the cooling apparatus 1 through a first circulation loop, and is connected to the external liquid supply apparatus through a second circulation loop. The first circulation loop includes a first pipeline 430 and a second pipeline 440, and the second circulation loop includes a third pipeline 450 and a fourth pipeline 460. The first pipeline 430 is in communication with the diversion inlet 102 on the cabinet body 10 of the cooling apparatus 1, the second pipeline 440 is in communication with the diversion outlet 103 on the cabinet body 10 of the cooling apparatus 1, and the third pipeline 450 and the fourth pipeline 460 are both in communication with the external liquid supply apparatus. Optionally, the heat exchanging device 40 may further include a flow meter 470, and the flow meter 470 may be disposed between the diversion pump 420 and the cabinet body 10 and used for detecting the flow rate of the cooling medium 80. The pressure of the diversion pump 420 may be adjusted according to the detection result of the flow meter 470, to achieve the purpose of adjusting the flow rate of the cooling medium 80. Each of the first pipeline 430 and the second pipeline 440 may be provided with a valve 480 to open or close a pipeline through which the cooling medium 80 circulates in the heat exchanging device 40.

When the cooling apparatus 1 of the present disclosure operates, the pump drives the cooling medium 80 to circulate in the cabinet body 10 of the cooling apparatus 1 through the first circulation loop, and the cooling medium 80 removes heat from the to-be-cooled device 90 through circulation in the cabinet body 10 and enters the heat exchanger 410 of the heat exchanging device 40. The external liquid supply apparatus can circularly provide cooling water in the second circulation loop, and the cooling medium 80 carrying the heat from the to-be-cooled device 90 may exchange heat in the heat exchanger 410 with the cooling water provided by the external liquid supply apparatus to discharge the heat carried by the cooling medium 80 so that the cooling medium 80 reaches a low temperature state again, which can cool the to-be-cooled device 90 again after circulating back into the cooling apparatus 1, thus achieving the purpose of circularly and continuously discharging the heat of the to-be-cooled device 90.

Embodiment 3

Figure 3:
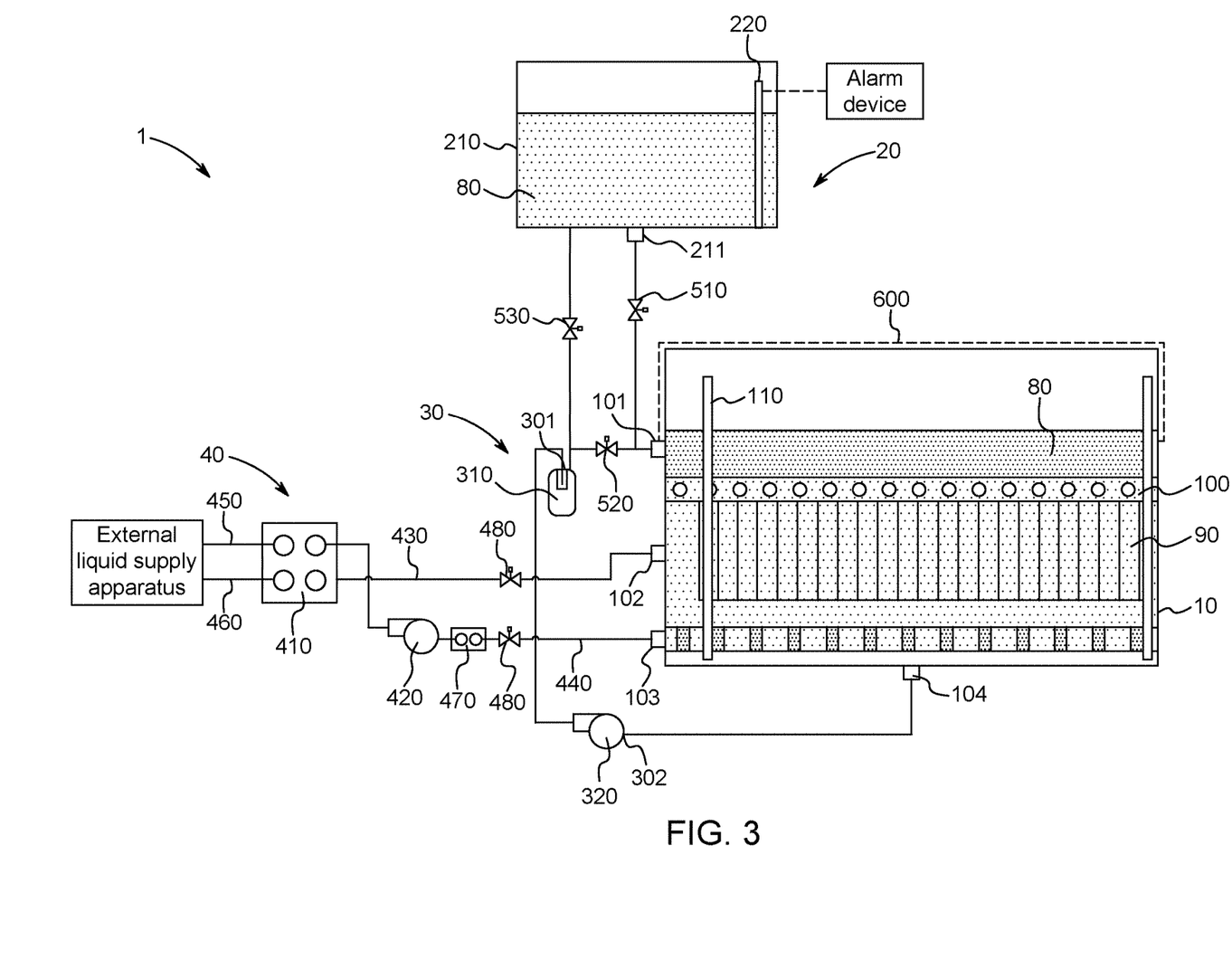
FIG. 3 is a schematic structural diagram of a yet another cooling apparatus according to an example embodiment of the present disclosure.

Referring to FIG. 3, an embodiment of the present disclosure provides a cooling apparatus 1 that uses a single-phase immersion liquid cooling technology for cooling a to-be-cooled device 90. The to-be-cooled device 90 may be a server in a data center, or it may be another heat-producing apparatus that needs to be cooled. The cooling apparatus 1 includes a cabinet body 10, a first volumeter 110, a replenishing device 20, and a filtering device 30. The cabinet body 10 may be provided with plug-in components 100, and the to-be-cooled device 90, which may be a sheet-type structure, is sequentially plugged into the plug-in components 100. The cabinet body 10 may contain a cooling medium 80 for at least partially immersing the to-be-cooled device 90. The cabinet body 10 has a first diversion opening 101 for introducing (receiving) the cooling medium 80, and also has a third diversion opening 104 for discharging the cooling medium 80. The first volumeter 110 is configured to detect the volume or level of the cooling medium 80 in the cabinet body 10. The replenishing device 20 includes a storage tank 210 for storing the cooling medium 80. The storage tank 210 and the cabinet body 10 are communicatively connected (coupled) to each other. The filtering device 30 has a fourth diversion opening 301 in communication with the first diversion opening 101 of the cabinet body 10, and also has a fifth diversion opening 302 in communication with the third diversion opening 104. The filtering device 30 is configured to drive the cooling medium 80 in the cabinet body 10 through the filtering device 30 for filtering. When the first volumeter 110 detects that the volume or level of the cooling medium 80 in the cabinet body 10 is higher than a third preset volume or level, the storage tank 210 and the cabinet body 10 come into mutual communication (that is, a connection between the storage tank and the cabinet body is opened), and the filtering device 30 drives the cooling medium 80 in the cabinet body 10 into the storage tank 210. The cooling medium 80 may completely immerse the to-be-cooled device 90, or it may partially immerse the to-be-cooled device 90; the level of immersion may be set according to actual needs. The cooling medium 80 may be a gaseous medium, a liquid medium, or a solid-liquid mixed medium, which may also be chosen according to actual needs. The first volumeter 110 may be a contact type or a non-contact type of volumeter, depending on actual needs. Corresponding changes may be made according to different cooling media 80. For example, if the cooling medium 80 is a liquid, the first volumeter 110 may be a liquid level gauge. In this embodiment, the cooling medium 80 completely immerses the to-be-cooled device 90, and the cooling medium 80 is a liquid electronic fluorinated liquid. The first volumeter 110 is disposed inside the cabinet body. The third diversion opening 104 may be disposed at the bottom of the cabinet body 10, the first diversion opening 101 and the fourth diversion opening 301 may be connected by a pipeline, and the third diversion opening 104 and the fifth diversion opening 302 may be connected by a pipeline.

It can be seen from the above technical solutions that the cooling apparatus 1 of the present embodiment combines the replenishing device 20 and the filtering device 30. When the cooling medium 80 in the cabinet body 10 exceeds the third preset volume or level (e.g., when the volume is overfilled), the storage tank 210 and the cabinet body 10 come into mutual communication, and the filtering device 30 drives the cooling medium 80 in the cabinet body 10 into the storage tank 210, thus avoiding the risk of overflow of excess cooling medium 80 into the cabinet body 10.

In an optional implementation, the cooling apparatus 1 of the present disclosure further includes a second volumeter 220 and an alarm device that are in communication. The second volumeter 220 is configured to detect the volume or level of the cooling medium 80 in the storage tank 210. When the second volumeter 220 detects that the volume or level of the cooling medium 80 in the storage tank 210 is lower than a second preset volume or level, the alarm device issues an alarm, further achieving the purpose of notifying an operator to replenish the storage tank 210. Optionally, the control system is in communication with both the second volumeter 220 and the alarm device. In response to detecting that the volume or level of the cooling medium 80 in the storage tank 210 is lower than a second preset volume or level, the second volumeter 220 sends a detection signal to the control system and the control system controls the alarm device to issue an alarm, thereby achieving the purpose of notifying an operator to replenish the storage tank 210. Optionally, the second volumeter 220 is disposed in the storage tank 210. The second volumeter 220 may be a contact type or a non-contact type of volumeter, depending on actual needs. Corresponding changes may be made according to different cooling media 80. For example, if the cooling medium 80 is a liquid, the second volumeter 220 may be a liquid level gauge.

In an optional implementation, the filtering device 30 includes a filter 310 and a driving pump 320 in communication with (coupled to) the filter 310. The driving pump 320 is configured to drive the cooling medium 80 in the cabinet body 10 through the filter 310 for filtering. Either the filter 310 or the driving pump 320 has the fourth diversion opening 301, and the other of the filter 310 and the driving pump 320 has the fifth diversion opening 302. In the example shown in FIG. 3, the driving pump 320 is located closer to the third diversion opening 104 of the cabinet body 10, and the filter 310 is located closer to the first diversion opening 101 of the cabinet body 10; accordingly, the fourth diversion opening 301 is disposed in the filter 310, and the fifth diversion opening 302 is disposed in the driving pump 320. If the cooling medium 80 in the cabinet body 10 is polluted during use, the cooling medium 80 in the cabinet body 10 can be driven by the driving pump 320 through the filter 310 for filtering so that impurities in the cooling medium 80 are filtered out, thus ensuring normal operation of the cooling apparatus 1. If the cooling medium 80 in the cabinet body 10 is polluted during use, the cooling medium 80 can be filtered by the filtering device 30 to filter out impurities in the cooling medium 80 to ensure normal operation of the cooling apparatus 1 with no need of manual replacement of the cooling medium 80 on a regular basis, which improves the maintenance efficiency of the cooling apparatus 1 and further improves the cooling efficiency of the cooling apparatus 1 for servers in data centers.

In an optional implementation, the cooling apparatus 1 of the present disclosure further includes a control system (not shown), a first detection system (not shown), and a second valve 520. In an embodiment, the second valve 520 is a solenoid valve, and the control system is in communication with the driving pump 320 of the filtering device 30, the first detection system, and the second valve 520. The first detection system is configured to detect the purity of the cooling medium 80 in the cabinet body 10, and the second valve 520 is disposed between the first diversion opening 101 and the fourth diversion opening 301, or between the third diversion opening 104 and the fifth diversion opening 302. In the example shown in FIG. 3, the second valve 520 is disposed between the first diversion opening 101 and the fourth diversion opening 301.

When the first detection system detects that the purity of the cooling medium 80 in the cabinet body 10 is lower than a set value, it indicates that the purity of the cooling medium 80 in the cabinet body 10 does not meet requirements, and so the first detection system then sends a detection signal to the control system, and the control system controls the second valve 520 to open and activates the driving pump 320 of the filtering device 30 so that the driving pump 320 drives the cooling medium 80 in the cabinet body 10 through the filter 310 for filtering, and thus the cooling medium 80 in the cabinet body 10 is filtered automatically. When the first detection system detects that the purity of the cooling medium 80 in the cabinet body 10 reaches a set value, it indicates that the purity of the cooling medium 80 in the cabinet body 10 meets requirements, and so the first detection system then sends a detection signal to the control system, and the control system controls the second valve 520 to close and stops the driving pump 320 of the filtering device 30 so that the driving pump 320 stops driving the cooling medium 80 in the cabinet body 10 through the filter 310. The control system may also control the second valve 520 to open and control the driving pump 320 to always be in an operating state so that the driving pump 320 circularly drives the cooling medium 80 in the cabinet body 10 through the filter 310 for filtering, thus ensuring that the cooling medium 80 in the cabinet body 10 is always filtered.

In an optional implementation, the cooling apparatus 1 of the present disclosure further includes a cover disposed at the top of the cabinet body 10, and a second detection system in communication with the control system. The second detection system is configured to detect the state (open/closed) of the cover. When the second detection system detects that the cover is in a closed state, it sends a first detection signal to the control system, and the control system controls the filtering device 30 to stop. When the second detection system detects that the cover is in an open state, it sends a second detection signal to the control system, and the control system controls the filtering device 30 to operate. In other words, the state (open or closed) of the cover of the cabinet body 10 is uses as the condition for triggering operation of the filtering device 30. When the cover of the cabinet body 10 is closed for normal cooling and heat dissipation, the filtering device 30 operates (starts). The filtering device 30 starts filtering the cooling medium 80 only when the cover of the cabinet body 10 is open, which can reduce energy consumption.

In an optional implementation, the storage tank 210 of the replenishing device 20 is in communication with (coupled to) the driving pump 320 of the filtering device 30. The driving pump 320 of the filtering device 30 is further configured to drive the cooling medium 80 between the storage tank 210 and the cabinet body 10; that is, the driving pump 320 of the filtering device 30 not only can drive the cooling medium 80 in the storage tank 210 so that it is transferred into the cabinet body 10, but also can drive the cooling medium 80 in the cabinet body 10 so that it is transferred into the storage tank 210. When the cooling medium 80 in the cabinet body 10 needs to be replenished, the cooling medium 80 in the storage tank 210 can be transferred into the cabinet body 10, driven by the driving pump 320. When the cooling medium 80 transferred into the cabinet body 10 exceeds the upper limit or when it is necessary to empty the cooling medium 80 in the cabinet body 10 (such as for the purpose of relocation), the cooling medium 80 in the cabinet body 10 can be transferred into the storage tank 210, driven by the driving pump 320.

Further, the cooling apparatus 1 of the present specification includes a third valve 530 disposed between the storage tank 210 and the driving pump 320. In an embodiment, the third valve 530 is a solenoid valve. In response to detecting that the volume or level of the cooling medium 80 in the cabinet body 10 has reached the third preset volume or level, the first volumeter 110 sends a detection signal to the control system, and the control system controls the third valve 530 to open and activates the driving pump 320 of the filtering device 30 so that the driving pump 320 drives the cooling medium 80 in the cabinet body 10 into the storage tank 210, and the excess cooling medium 80 in the cabinet body 10 is pumped into the storage tank 210, thus avoiding the risk of overflow of excess cooling medium 80 in the cabinet body 10. In response to detecting that the volume of the cooling medium 80 in the cabinet body 10 is restored to the third preset volume or level, the first volumeter 110 sends a detection signal to the control system, and the control system controls the third valve 530 to close and stops the driving pump 320 of the filtering device 30 so that the driving pump 320 stops driving the cooling medium 80 in the cabinet body 10 into the storage tank 210, thus stopping the pumping of the cooling medium 80 from the cabinet body 10.

When it is necessary to empty the cooling medium 80 in the cabinet body 10, the third valve 530 can be directly controlled by the control system to open, and the driving pump 320 of the filtering device 30 is activated so that the driving pump 320 drives the cooling medium 80 in the cabinet body 10 into the storage tank 210 until the cooling medium 80 in the cabinet body 10 is completely pumped out; the third valve 530 is then closed by the control system, and the driving pump 320 is stopped. The driving pump 320 of the filtering device 30 is used to perform an integrated drainage operation on the cooling medium 80 in the cabinet body 10, and no additional apparatus is required to pump the cooling medium 80 out of the cabinet body 10.

In response to detecting that the volume or level of the cooling medium 80 in the cabinet body 10 is lower than the first preset volume or level, the first volumeter 110 sends a detection signal to the control system, and the control system controls the first valve 510 to open so that the storage tank 210 and the cabinet body 10 come into mutual communication, and the driving pump 320 of the filtering device 30 is activated so that the driving pump 320 drives the cooling medium 80 in the storage tank 210 into the cabinet body 10, and thus the cabinet body 10 is automatically replenished. In response to detecting that the volume or level of the cooling medium 80 in the cabinet body 10 reaches the third preset volume or level, the first volumeter 110 sends a detection signal to the control system, and the control system controls the first valve 510 to close so that the storage tank 210 and the cabinet body 10 are closed with respect to each other, and the driving pump 320 of the filtering device 30 is stopped so that the driving pump 320 stops driving the cooling medium 80 in the storage tank 210 into the cabinet body 10, thus stopping replenishing the cooling medium in the cabinet body 10. The third preset volume/level here is higher than the first preset volume/level, which means that the first preset volume or level indicates the lower limit of the allowable volume range of the cooling medium 80 in the cabinet body 10, and the third preset volume or level indicates the upper limit of the allowable volume range of the cooling medium 80 in the cabinet body 10.

In an optional implementation, the cooling apparatus 1 of the present disclosure further includes a first valve 510. The first valve 510 is configured for switching between mutual communication and mutual closure of the storage tank 210 and the cabinet body 10, and the control system is in communication with the driving pump 320 of the filtering device 30, the first volumeter 110, and the first valve 510. In response to detecting that the volume or level of the cooling medium 80 in the cabinet body 10 is lower than the first preset volume or level, the first volumeter 110 sends a detection signal to the control system, and the control system controls the first valve 510 to open so that the storage tank 210 and the cabinet body 10 come into mutual communication, and the driving device is activated so that the driving pump 320 of the filtering device 30 drives the cooling medium 80 in the storage tank 210 into the cabinet body 10, and thus the cabinet body 10 is automatically replenished. In response to detecting that the volume or level of the cooling medium 80 in the cabinet body 10 reaches the first preset volume or level, the first volumeter 110 sends a detection signal to the control system, and the control system controls the first valve 510 to close so that the storage tank 210 and the cabinet body 10 are closed with respect to each other, and the driving pump 320 of the filtering device 30 stops driving the cooling medium 80 in the storage tank 210 into the cabinet body 10, thus stopping replenishing the cabinet body 10. The control system controls the first valve 510 and the driving pump 320 of the filtering device 30 to open or close, thereby achieving the purpose of automatically replenishing the cabinet body 10 or stopping the replenishing the cabinet body 10 with no need of manual intervention or involvement. Therefore, the maintenance efficiency of the cooling apparatus 1 is improved, and the cooling efficiency of the cooling apparatus 1 for servers in data centers is further improved. Optionally, the first valve 510 is a solenoid valve.

In an optional implementation, the storage tank 210 has a second diversion opening 211 in communication with the first diversion opening 101 of the cabinet body 10, the first valve 510 is disposed between the first diversion opening 101 and the second diversion opening 211 or is disposed inside the storage tank 210 at a position corresponding to the second diversion opening 211, and the first diversion opening 101 and the second diversion opening 211 may be connected through a pipeline. Further, the storage tank 210 is disposed above the cabinet body 10, and the second diversion opening 211 is located above the first diversion opening 101 so that the liquid level of the cooling medium 80 in the storage tank 210 is higher than the liquid level of the cooling medium 80 in the cabinet body 10. When the cooling medium 80 in cabinet body 10 needs to be replenished, the first valve 510 is opened so that the cooling medium 80 in the storage tank 210 can directly flow into the cabinet body 10 under the force of gravity.

In an optional implementation, the cooling apparatus 1 of the present disclosure further includes a heat exchanging device 40, where one end of the heat exchanging device 40 is in communication with (coupled to) the cabinet body 10, and the other end of the heat exchanging device 40 is in communication with (coupled to) an external liquid supply apparatus. The heat exchanging device 40 is configured to drive the cooling medium 80 to circulate in the cabinet body 10 and to exchange heat with the cooling medium 80. The heat exchanging device 40 drives the cooling medium 80 to circulate in the cabinet body 10 of the cooling apparatus 1 to remove heat from the to-be-cooled device 90, and the heat exchanging device 40 exchanges heat with the external liquid supply apparatus so that the cooling medium 80 reaches a low temperature state again, and circulates back into the cabinet body 10 of the cooling apparatus 1 to cool the to-be-cooled device 90, thus achieving the purpose of circularly and continuously removing and discharging heat from the to-be-cooled device 90.

Further, the cabinet body 10 has a diversion inlet 102 for introducing (receiving) the cooling medium 80, and a diversion outlet 103 for discharging the cooling medium 80. The heat exchanging device 40 includes a heat exchanger 410 and a diversion pump 420. The heat exchanger 410 is connected to the cooling body 10 of the cooling apparatus 1 through a first circulation loop, and is connected to the external liquid supply apparatus through a second circulation loop. The first circulation loop includes a first pipeline 430 and a second pipeline 440, and the second circulation loop includes a third pipeline 450 and a fourth pipeline 460. The first pipeline 430 is in communication with the diversion inlet 102 on the cabinet body 10 of the cooling apparatus 1, the second pipeline 440 is in communication with the diversion outlet 103 on the cabinet body 10 of the cooling apparatus 1, and the third pipeline 450 and the fourth pipeline 460 are both in communication with the external liquid supply apparatus. Optionally, the heat exchanging device 40 may further include a flow meter 470, and the flow meter 470 may be disposed between the diversion pump 420 and the cabinet body 10 and used for detecting the flow rate of the cooling medium 80. The pressure of the diversion pump 420 may be adjusted according to the detection result of the flow meter 470, to achieve the purpose of adjusting the flow rate of the cooling medium 80. Each of the first pipeline 430 and the second pipeline 440 may has a valve 480 to open or close a pipeline passage through which the cooling medium 80 circulates in the heat exchanging device 40.

When the cooling apparatus 1 of the present disclosure operates, the pump drives the cooling medium 80 to circulate in the cabinet body 10 through the first circulation loop, and the cooling medium 80 removes heat from the to-be-cooled device 90 through the circulation in the cabinet body 10 of the cooling apparatus 1 and enters the heat exchanger 410 of the heat exchanging device 40. The external liquid supply apparatus can circularly provide cooling water in the second circulation loop, and the cooling medium 80 carrying the heat of the to-be-cooled device 90 may exchange heat in the heat exchanger 410 with the cooling water provided by the external liquid supply apparatus to discharge the heat carried by the cooling medium 80, so that the cooling medium 80 reaches a low temperature state again, which can cool the to-be-cooled device 90 again after circulating back into the cooling apparatus 1, thus achieving the purpose of circularly and continuously discharging the heat of the to-be-cooled device 90.

Those skilled in the art may conceive of other implementations of the present disclosure after considering the specification and practicing the invention disclosed herein. The present disclosure is intended to cover any variations, uses, or adaptations of the present disclosure. These modifications, uses, or adaptations follow the general principles of the present disclosure and include the common general knowledge or conventional technical means in the technical field not disclosed in the present disclosure. The disclosure and embodiments are considered as examples only, with a true scope and spirit of the present disclosure being indicated by the following claims.

It should be further noted that the terms "include," "comprise," or any other variations thereof are intended to cover non-exclusive inclusions such that a process, method, article, or apparatus that includes a series of elements not only includes those elements but also includes other elements that are not listed explicitly, or also include inherent elements of the process, method, article, or apparatus. In the absence of more limitations, an element defined by the sentence "including a/an . . . " does not exclude that the process, method, article, or apparatus including the element further has other identical elements.

The embodiments described above are merely embodiments of the present disclosure and not intended to limit the present disclosure. Any of modifications, equivalent substitutions, improvements, and the like, made within the spirit and principle of the present disclosure, shall be covered in the scope of the present disclosure.

Embodiments according to the invention are thus described. While the present disclosure has been described in particular embodiments, it should be appreciated that the invention should not be construed as limited by such embodiments, but rather construed according to the following claims.

What is claimed is:

1. A cooling apparatus for cooling a to-be-cooled device, wherein the cooling apparatus comprises:
    a cabinet body configured to contain a cooling medium for at least partially immersing the to-be-cooled device;
    a first volumeter for detecting a volume of the cooling medium in the cabinet body;
    a replenishing device coupled to the cabinet body and comprising a storage tank storing the cooling medium,
    a cover disposed at top of the cabinet body; and
    a filtering device, wherein the filtering device configured to drive the cooling medium in the cabinet body through the filtering device for filtering of the cooling medium, and wherein an operation of the filtering device is controlled based on a state of the cover,
    wherein when the first volumeter detects that the volume of the cooling medium in the cabinet body is lower than a first preset volume, then the cooling medium in the storage tank is transferred from the storage tank into the cabinet body,
    wherein when the first volumeter detects that the volume of the cooling medium in the cabinet body exceeds a second preset volume, then a connection between the storage tank and the cabinet body is opened, wherein the second preset volume is higher than the first present volume, and
    wherein when the first volumeter detects that the volume of the cooling medium in the cabinet body is restored to the second preset volume, then the connection between the storage tank and the cabinet body is closed.

2. The cooling apparatus according to claim 1, further comprising a second volumeter and an alarm device communicatively coupled to the second volumeter, wherein the second volumeter is configured to detect a volume of the cooling medium in the storage tank, and wherein when the second volumeter detects that the volume of the cooling medium in the storage tank is lower than a third preset volume, then the alarm device issues an alarm.

3. The cooling apparatus according to claim 1, further comprising a driving device for driving the cooling medium between the storage tank and the cabinet body.

4. The cooling apparatus according to claim 3, wherein when the first volumeter detects that the volume of the cooling medium in the cabinet body is lower than the first preset volume, then the connection between the storage tank and the cabinet body is opened and the driving device drives the cooling medium in the storage tank into the cabinet body, and wherein when the first volumeter detects that the volume of the cooling medium in the cabinet body reaches the second preset volume, then the connection between the storage tank and the cabinet body is closed and the driving device stops driving the cooling medium into the cabinet body.

5. The cooling apparatus according to claim 3, wherein when the first volumeter detects that the volume of the cooling medium in the cabinet body exceeds the second preset volume, then the driving device drives the cooling medium in the cabinet body into the storage tank, and wherein when the first volumeter detects that the volume of the cooling medium in the cabinet body is restored to the second preset volume, then the driving device stops driving the cooling medium into the storage tank.

6. The cooling apparatus according to claim 1, further comprising a valve configured for switching between opening and closing the connection between the storage tank and the cabinet body, wherein when the first volumeter detects that the volume of the cooling medium in the cabinet body is lower than the first preset volume, then the valve is opened so that the connection between the storage tank and the cabinet body is opened, and wherein when the first volumeter detects that the volume of the cooling medium in the cabinet body reaches the first preset volume, then the valve is closed.

7. The cooling apparatus according to claim 6, wherein the cabinet body has a first diversion opening for guiding the cooling medium, wherein the storage tank has a second diversion opening in communication with the first diversion opening, and wherein the valve is disposed in a position that is either between the first diversion opening and the second diversion opening or inside the storage tank at a position corresponding to the second diversion opening.

8. The cooling apparatus according to claim 7, wherein the storage tank is disposed above the cabinet body, and wherein the second diversion opening is located above the first diversion opening.

9. The cooling apparatus according to claim 1, further comprising a heat exchanging device, wherein an end of the heat exchanging device is coupled to the cabinet body and another end of the heat exchanging device is coupled to an external liquid supply apparatus, and wherein the heat exchanging device is configured to drive the cooling medium to circulate in the cabinet body and to exchange heat with the cooling medium.

10. A cooling apparatus for cooling a to-be-cooled device, wherein the cooling apparatus comprises:
a cabinet body configured to contain a cooling medium for at least partially immersing the to-be-cooled device, wherein the cabinet body has a first diversion opening for receiving the cooling medium and a second diversion opening for discharging the cooling medium;
a cover disposed at top of the cabinet body; and
a filtering device, wherein the filtering device has a third diversion opening in communication with the first diversion opening and a fourth diversion opening in communication with the second diversion opening, wherein the filtering device is configured to drive the cooling medium in the cabinet body through the filtering device for filtering of the cooling medium, and wherein an operation of the filtering device is controlled based on a state of the cover.

11. The cooling apparatus according to claim 10, wherein the filtering device comprises a filter and a driving pump coupled to the filter, wherein the driving pump is configured to drive the cooling medium in the cabinet body through the filter for filtering of the cooling medium, and wherein one of the filter and the driving pump is provided with the third diversion opening, and the other of the filter and the driving pump is provided with the fourth diversion opening.

12. The cooling apparatus according to claim 11, further comprising a storage device coupled to the driving pump, wherein the driving pump is configured to drive the cooling medium in the cabinet body into the storage device.

13. The cooling apparatus according to claim 12, further comprising a valve disposed between the storage device and the driving pump, wherein when the valve is opened, the driving pump drives the cooling medium in the cabinet body into the storage device.

14. The cooling apparatus according to claim 11, further comprising a valve disposed in a position that is either between the first diversion opening and the third diversion opening or between the second diversion opening and the fourth diversion opening, wherein when purity of the cooling medium in the cabinet body is lower than a set value, then the valve is opened and the driving pump drives the cooling medium in the cabinet body through the filter for filtering.

15. The cooling apparatus according to claim 10, wherein when the cover is detected to be in a closed state, then the filtering device is stopped, and wherein when the cover is detected to be in an open state, then the filtering device is started.

16. The cooling apparatus according to claim 10, further comprising a heat exchanging device, wherein an end of the heat exchanging device is coupled to the cabinet body and another end of the heat exchanging device is coupled to an external liquid supply apparatus, and wherein the heat exchanging device is configured to drive the cooling medium to circulate in the cabinet body and to exchange heat with the cooling medium.

17. A cooling apparatus for cooling a to-be-cooled device, wherein the cooling apparatus comprises:
a cabinet body configured to contain a cooling medium for at least partially immersing the to-be-cooled device, wherein the cabinet body is provided with a first diversion opening for receiving the cooling medium and a second diversion opening for discharging the cooling medium;
a first volumeter for detecting a volume of the cooling medium in the cabinet body;
a replenishing device coupled to the cabinet body and comprising a storage tank storing the cooling medium;
a cover disposed at top of the cabinet body; and
a filtering device, wherein the filtering device has a third diversion opening in communication with the first diversion opening and a fourth diversion opening in communication with the second diversion opening, wherein the filtering device is configured to drive the cooling medium in the cabinet body through the filtering device for filtering of the cooling medium, and wherein an operation of the filtering device is controlled based on a state of the cover, and wherein when the first volumeter detects that the volume of the cooling medium in the cabinet body exceeds a first preset volume, then the filtering device drives the cooling medium in the cabinet body into the storage tank.

18. The cooling apparatus according to claim 17, further comprising a second volumeter and an alarm device communicatively coupled to the alarm device, wherein the second volumeter is configured to detect the volume of the cooling medium in the storage tank, and wherein when the second volumeter detects that the volume of the cooling medium in the storage tank is lower than a second preset volume, then the alarm device issues an alarm.

19. The cooling apparatus according to claim 17, wherein the filtering device comprises a filter and a driving pump coupled to the filter, wherein the driving pump is configured to drive the cooling medium in the cabinet body through the filter for filtering of the cooling medium, and wherein one of the filter and the driving pump has the third diversion opening, and the other of the filter and the driving pump has the fourth diversion opening.

20. The cooling apparatus according to claim 19, further comprising a valve disposed in a position that is either between the first diversion opening and the third diversion opening or between the second diversion opening and the fourth diversion opening, wherein when purity of the cooling medium in the cabinet body is lower than a set value, then the valve is opened and the driving pump drives the cooling medium in the cabinet body through the filter for filtering of the cooling medium.

21. The cooling apparatus according to claim 17, wherein the filtering device comprises a driving pump for driving the cooling medium between the storage tank and the cabinet body, wherein when the first volumeter detects that the volume of the cooling medium in the cabinet body exceeds the first preset volume, then a connection between the storage tank and the cabinet body is opened and the driving pump drives the cooling medium in the cabinet body into the storage tank, and wherein when the first volumeter detects that the volume of the cooling medium in the cabinet body is restored to the first preset volume, then the connection between the storage tank and the cabinet body is closed and the driving pump stops.

22. The cooling apparatus according to claim 17, wherein when the first volumeter detects that the volume of the cooling medium in the cabinet body is lower than a second preset volume, then a connection between the storage tank and the cabinet body is opened and the filtering device drives the cooling medium in the storage tank into the cabinet body.

23. The cooling apparatus according to claim 22, wherein the filtering device comprises a driving pump for driving the cooling medium between the storage tank and the cabinet body, wherein when the first volumeter detects that the volume of the cooling medium in the cabinet body is lower than the second preset volume, then a connection between the storage tank and the cabinet body is opened and the driving pump drives the cooling medium in the storage tank into the cabinet body, and wherein when the first volumeter detects that the volume of the cooling medium in the cabinet body reaches the first preset volume, then the connection between the storage tank and the cabinet body is closed and the driving pump stops, wherein the second preset volume is lower than the first preset volume.

24. The cooling apparatus according to claim 22, further comprising a valve configured for switching between opening and closing the connection between the storage tank and the cabinet body, wherein when the first volumeter detects that the volume of the cooling medium in the cabinet body is lower than the first preset volume, then the valve is opened so that the connection between the storage tank and the cabinet body is opened, and wherein when the first volumeter detects that the volume of the cooling medium in the cabinet body reaches the second preset volume, then the valve is closed so that the connection between the storage tank and the cabinet body is closed.

25. The cooling apparatus according to claim 24, wherein the storage tank has a fifth diversion opening in communication with the first diversion opening, and wherein the valve is disposed in a position that is either between the first diversion opening and the fifth diversion opening or inside the storage tank at a position corresponding to the fifth diversion opening.

26. The cooling apparatus according to claim 25, wherein the storage tank is disposed above the cabinet body, and the fifth diversion opening is located above the first diversion opening.

27. The cooling apparatus according to claim 17, further comprising a heat exchanging device, wherein an end of the heat exchanging device is coupled to the cabinet body and another end of the heat exchanging device is coupled to an external liquid supply apparatus, and wherein the heat exchanging device is configured to drive the cooling medium to circulate in the cabinet body and to exchange heat with the cooling medium.

* * * * *